United States Patent
Wang et al.

(10) Patent No.: US 10,090,780 B2
(45) Date of Patent: Oct. 2, 2018

(54) DEVICE WITH ELECTRODE CONNECTED TO THROUGH WIRE, AND METHOD FOR MANUFACTURING THE SAME

(71) Applicant: CANON KABUSHIKI KAISHA, Tokyo (JP)

(72) Inventors: Shinan Wang, Komae (JP); Yutaka Setomoto, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 14/818,153

(22) Filed: Aug. 4, 2015

(65) Prior Publication Data
US 2016/0043660 A1 Feb. 11, 2016

(30) Foreign Application Priority Data
Aug. 8, 2014 (JP) .................. 2014-161989

(51) Int. Cl.
| | |
|---|---|
| G01B 7/16 | (2006.01) |
| H02N 1/00 | (2006.01) |
| B06B 1/02 | (2006.01) |
| B81C 1/00 | (2006.01) |
| H01L 21/768 | (2006.01) |
| G01L 1/14 | (2006.01) |
| H01L 23/48 | (2006.01) |

(52) U.S. Cl.
CPC ............. *H02N 1/00* (2013.01); *B06B 1/0292* (2013.01); *B81C 1/00* (2013.01); *B81C 1/00134* (2013.01); *G01L 1/14* (2013.01); *H01L 21/76898* (2013.01); *H01L 23/481* (2013.01); *B81C 1/00373* (2013.01); *B81C 1/00611* (2013.01); *H01L 21/76849* (2013.01); *H01L 2924/0002* (2013.01)

(58) Field of Classification Search
CPC .. H02N 1/00; H02N 1/76898; B81C 1/00373; B81C 1/00; B81C 1/00134; B06B 1/0292; G01L 1/14; G01L 1/142; G01B 7/16; G01B 7/18; G01B 5/30
USPC .................................. 73/780, 744, 763, 760
See application file for complete search history.

(56) References Cited

U.S. PATENT DOCUMENTS

| | | | |
|---|---|---|---|
| 2006/0097378 A1 * | 5/2006 | Yamano | ............ H01L 21/76898 257/698 |
| 2007/0264732 A1 | 11/2007 | Chen | |

(Continued)

FOREIGN PATENT DOCUMENTS

| | | |
|---|---|---|
| JP | 2003-298200 A | 10/2003 |
| JP | 2005-303258 A | 10/2005 |

(Continued)

*Primary Examiner* — Manish S Shah
*Assistant Examiner* — Nigel Plumb
(74) *Attorney, Agent, or Firm* — Canon U.S.A., Inc. IP Division

(57) ABSTRACT

A capacitive transducer includes a substrate having a first surface and a second surface opposite the first surface, the substrate including a through wire extending therethrough between the first surface and the second surface, and a cell on the first surface, the cell including a first electrode and a second electrode spaced apart from the first electrode with a gap between the first electrode and the second electrode. Conductive protective films are disposed over surfaces of the through wire on the first surface side and the second surface side of the substrate.

23 Claims, 5 Drawing Sheets

(56) References Cited

U.S. PATENT DOCUMENTS

| | | | | |
|---|---|---|---|---|
| 2009/0262605 A1* | 10/2009 | Wakabayashi | ........ | B06B 1/0292 |
| | | | | 367/181 |
| 2011/0074039 A1 | 3/2011 | Zhang | | |
| 2012/0306085 A1* | 12/2012 | West | ..................... | H01L 23/481 |
| | | | | 257/762 |
| 2014/0010388 A1 | 1/2014 | Akiyama | | |

FOREIGN PATENT DOCUMENTS

| | | |
|---|---|---|
| JP | 2006-135175 A | 5/2006 |
| JP | 2008-300782 A | 12/2008 |
| JP | 2010-045371 A | 2/2010 |
| JP | 2010-185798 A | 8/2010 |
| JP | 2011-254281 A | 12/2011 |
| JP | 2012-244100 A | 12/2012 |
| JP | 2013-138411 A | 7/2013 |
| JP | 2014-130767 A | 7/2014 |
| RU | 2427811 C1 | 8/2011 |
| WO | 2006/129525 A1 | 12/2006 |

* cited by examiner

DEVICE WITH ELECTRODE CONNECTED TO THROUGH WIRE, AND METHOD FOR MANUFACTURING THE SAME

BACKGROUND OF THE INVENTION

Field of the Invention

The present invention generally relates to devices whose electrode is electrically connected to a through wire, such as capacitive transducers used as ultrasonic transducing devices and the like, and methods for manufacturing the devices. More specifically, the present invention relates to a capacitive transducer including a through electrode on a substrate, and a method for manufacturing the capacitive transducer.

Description of the Related Art

Capacitive micromachined ultrasonic transducers (CMUTs) have been hitherto investigated as a replacement of piezoelectric devices. CMUTs have capabilities to transmit and receive an acoustic wave such as an ultrasonic wave by using the vibration of a vibration film, and to easily obtain excellent broadband characteristics particularly in liquids. In practice, a plurality of elements, each of which is composed of a plurality of vibration films (or cells) arranged in a two-dimensional array, are arranged on a substrate to form a single device, thereby implementing the desired performance. Independent control of the respective elements requires connection wires to be formed, each corresponding to one of the elements.

In the structure described above, it is desirable to use a through wire or through electrode extending through a substrate to reduce the size of a device and the parasitic capacitance of a connection wire. Methods for manufacturing a device that includes a through wire include a "via first" approach and a "via last" approach. In the via-first approach, a through wire that extends through a substrate is formed prior to the formation of a device. In the via-last approach, in contrast, a through wire that extends through a substrate is formed after the formation of a device. The via-first approach may be desirable in terms of device performance or manufacture.

U.S. Patent Application Publication No. 2007/0264732 discloses a CMUT that includes a through wire. The disclosed CMUT is manufactured using a via-first approach, and polysilicon is used as a material of the through wire. The through wire composed of polysilicon has relatively high process resistance in the manufacturing process after the formation of the through wire, and also has relatively high environmental resistance in the use of the CMUT. Japanese Patent Laid-Open No. 2010-45371 discloses a through-electrode structure having a conductive through wire. The conductive through wire has a conductive protective film on a bottom thereof to prevent the conductive through wire from being subjected to surface oxidation and damage.

In the CMUT disclosed in U.S. Patent Application Publication No. 2007/0264732, the through wire is composed of high-resistivity polysilicon, and it is not easy to reduce the resistance of the through wire. As a result, a reduction in the device characteristics of the CMUT is likely to occur. A through wire composed mainly of a low-resistance metal (such as Cu) is preferable in terms of the device characteristics of the CMUT. In the through-electrode structure disclosed in Japanese Patent Laid-Open No. 2010-45371, a through wire composed of a conductive material is used to reduce the resistance of the through wire. On the other hand, the complexity of the manufacturing process for the through wire is high. In addition, a portion of the through wire is exposed through the protective film. If a device such as a CMUT is fabricated by via-first using the through-wire structure described above, the exposed portion of the through wire may be chemically or mechanically damaged in the fabrication process. As a result, the through wire is prone to developing surface roughness or a reduction in length, which may not facilitate reliable and low-resistance connection with a lead wire. In general, reduced chemical or mechanical damage requires a limitation on the material of the through wire or an increase in the number of steps in the device manufacturing process. Such a requirement is likely to lead to a reduction in device performance or an increase in manufacturing costs. In light of such technical issues, it is desirable to easily manufacture a low-resistance high-chemical-resistance through-wire structure to maintain device performance and reduce manufacturing costs.

SUMMARY OF THE INVENTION

Accordingly, a capacitive transducer according to an aspect of the present invention includes a substrate having a first surface and a second surface opposite the first surface, the substrate including a through wire extending therethrough between the first surface and the second surface, and a cell on the first surface, the cell including a first electrode and a second electrode spaced apart from the first electrode with a gap between the first electrode and the second electrode. A conductive protective film is disposed over a surface of the through wire on the first surface side of the substrate, and a conductive protective film is disposed over a surface of the through wire on the second surface side of the substrate.

A device according to another aspect of the present invention includes a substrate having a first surface and a second surface opposite the first surface, the substrate including a through wire extending therethrough between the first surface and the second surface, and an electrode electrically connected to the through wire. A conductive protective film is disposed over a surface of the through wire on the first surface side of the substrate, and a conductive protective film is disposed over a surface of the through wire on the second surface side of the substrate.

Further features of the present invention will become apparent from the following description of exemplary embodiments with reference to the attached drawings.

DESCRIPTION OF THE EMBODIMENTS

An embodiment of the present invention provides a device including a substrate having a first surface and a second surface opposite the first surface, the substrate including a through wire extending therethrough between the first surface and the second surface, and an electrode electrically connected to the through wire, in which a conductive protective film is disposed over a surface of the through wire on the first surface side of the substrate, and a conductive protective film is disposed over a surface of the through wire on the second surface side of the substrate. The device is, for example, a capacitive transducer including a cell on the first surface of the substrate, the cell including a first electrode and a second electrode spaced apart from the first electrode with a gap between the first electrode and the second electrode. A method for manufacturing the capacitive transducer includes forming a conductive protective film over a surface of the through wire on the first surface side of the substrate and a conductive protective film over a surface of the through wire on the second surface side of the substrate, and forming a cell having the structure described above on the first surface of the substrate.

Embodiments of the present invention and examples thereof will be described hereinafter with reference to the drawings.

First Embodiment

Figure 1:
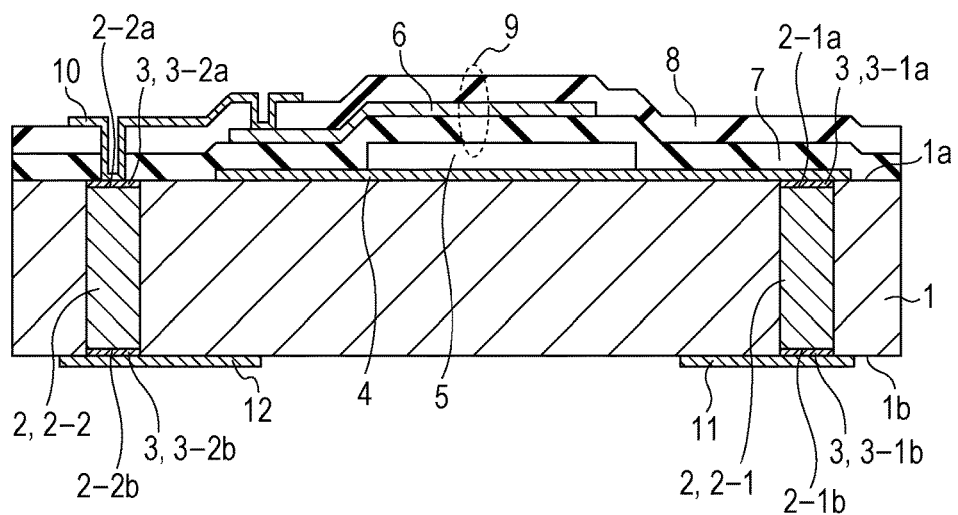
FIG. 1 is a diagram illustrating a structure of a capacitive transducer according to a first embodiment of the present invention.

The basic configuration of a capacitive transducer according to a first embodiment of the present invention will be described with reference to FIG. 1. FIG. 1 is a cross-sectional view of the capacitive transducer. In FIG. 1, only one cell (i.e., one vibration film) of the capacitive transducer is illustrated, for ease of understanding.

As illustrated in FIG. 1, the capacitive transducer according to this embodiment includes a plurality of cells each having the following structure. Each cell includes through wires 2 (including 2-1 and 2-2) extending through a substrate 1 between a first surface 1a of the substrate 1 and a second surface 1b opposite the first surface 1a, a first electrode 4 disposed on the first surface 1a side of the substrate 1, and a second electrode 6 disposed above the first electrode 4 with a gap (or cavity) 5 between the second electrode 6 and the first electrode 4. A vibration film 9 formed by insulating films 7 and 8 disposed so that the second electrode 6 is interposed therebetween is supported so as to be capable of vibrating. Conductive protective films 3 (3-1a and 3-2a or 3-1b and 3-2b) are formed on surfaces (2-1a, 2-2a, 2-1b, and 2-2b) of the through wires 2 on the first surface 1a side and the second surface 1b side. A conductive protective film serves to ensure low-resistance connection of a through wire, increase the physical and chemical resistance of the through wire, and improve the planarity of a surface of the through wire.

Improvement in planarity will be described. A substrate surface including an end surface of a through wire or through electrode is typically smoothed by chemical mechanical polishing (CMP) or the like. In particular, it is desirable to remove a portion of the through electrode exposed from the substrate surface or a foreign substance. Accurate gap control is important for capacitive transducers. For this reason, it is desirable that a substrate surface on the main surface (first surface) side have a sufficiently smaller surface roughness than the size (or thickness) of a gap (e.g., the gap 5), and it is desirable that, if the gap has a thickness of approximately 200 nm, smoothing be performed so that the maximum surface roughness (Rmax) becomes less than or equal to 20 nm. Smoothing the through electrode often results in the formation of irregularities seen in CMP, called "dishing" or "erosion". Dishing is caused by excessive polishing of the wire surface, and erosion is caused by excessive polishing of an insulating film. Irregularities may also be caused by an internal defect in a film deposition condition of a through electrode or by the through electrode being damaged by foreign substances involved during CMP. The irregularities, such as dishing, have a size of the order of several micrometers (μm), and are not easy to control.

A further description will be given. A through-electrode substrate includes a through electrode which is generally made mainly of low-resistance copper. A substrate fabricated by forming a through-hole in a silicon substrate or the like and burying a copper electrode in the through-hole is likely to have irregularities between the substrate and the copper through electrode, as described above. The reason for this is that dishing is likely to occur in the CMP process for smoothing the surface in which copper has been buried. In addition, irregularities are likely to occur due to the difference in thermal expansion coefficients from the substrate, for example. In order to insulate or protect the through electrode in the structure described above, an insulating film or the like is formed using plasma chemical vapor deposition (CVD) with high coatability. However, it is difficult to completely protect the electrode for the following reasons: (a) the insulating film has a thickness of the order of several hundreds of nanometers (nm) whereas irregularities appear with the size of dishing of the order of several micrometers (μm), and (b) a crack is likely to occur in the insulating film due to the difference in thermal expansion coefficients since high-temperature treatment is required. Thus, sacrificial layer etching in the process of fabricating a capacitive transducer on a through-electrode substrate may be likely to result in a through electrode being damaged by pinhole leaks, as described above. In this embodiment, such a difficulty is overcome by providing a conductive protective film on a surface of a through wire.

Referring back to the configuration, the material of the substrate 1 is selected in accordance with the required performance of the capacitive transducer. For example, the substrate 1 is composed of an insulating material such as glass. The substrate 1 may be composed of either high-resistance silicon or low-resistance silicon. The substrate 1 has a thickness of, for example, 100 μm to 1000 μm. An insulating film (not illustrated) may be disposed on surfaces of the first surface 1a and the second surface 1b of the substrate 1 and on a surface of the substrate 1 including the sidewalls of through holes in the substrate 1 that accommodate the through wires 2, in accordance with the need for electrical insulation.

The through wires 2 are composed of a high-conductivity material. For example, the through wires 2 are composed of a material containing a metal. Desirably, the through wires 2 are formed of a low-resistance material (such as Cu or a Cu alloy), mainly (which means, in this specification, a major proportion of composition) Cu. The through wires 2 may be configured such that the end surfaces 2-1a and 2-2a on the first surface 1a side of the substrate 1 are recessed toward the inside of the substrate 1 from the first surface 1a or project outward from the substrate 1. Desirably, the end surfaces 2-1a and 2-2a are recessed toward the inside of the substrate 1 from the first surface 1a by approximately 0.1 μm to 5 μm. Such a recess may be formed by dishing described above.

Also, the through wires 2 may be configured such that the end surfaces 2-1b and 2-2b on the second surface 1b side of the substrate 1 are recessed toward the inside of the substrate 1 from the second surface 1b or project outward from the substrate 1. Desirably, the end surfaces 2-1b and 2-2b are recessed toward the inside of the substrate 1 from the second surface 1b of the substrate 1 by approximately 0.1 μm to 5

μm. The shape of the cross section of the through wires 2, as viewed in a direction perpendicular to the first surface 1a of the substrate 1, is designed in accordance with the capacitance and resistance of the through wires 2 and the easiness of fabrication. The cross section of the through wires 2 may have a uniform or non-uniform shape in the lengthwise direction of the through wires 2. By way of example, each of the through wires 2 has a substantially circular cross section, when viewed in a direction perpendicular to the first surface 1a of the substrate 1, and has a diameter of 5 μm to 100 μm.

The reason that it is desirable that end surfaces of a through wire be recessed from a substrate surface will be described. It is ideally preferable that end surfaces of a through wire be slightly recessed from a substrate surface to such an extent that conductive protective films are formed on the end surfaces of the through wire to make the surfaces of the conductive protective films flush with the substrate surface. A through wire projecting from the substrate surface may cause the following issues:

(1) A conductive protective film that is subsequently formed will also project from the substrate surface, and further expand sideways.
(2) A projection of 5 μm or more will cause an element that is subsequently formed, such as a wire or a film, to be discontinuous at the through wire due to the presence of a step ("step discontinuity") or will cause non-uniformity in photoresist thickness in the photoresist coating process for photolithography.

In contrast, a through wire recessed from a substrate surface can prevent a conductive protective film that is subsequently formed from also projecting from the substrate surface. It is to be noted that a recess as deep as 5 μm or more may cause an element that is subsequently formed, such as a wire or a film, to be discontinuous at the through wire due to the presence of a step ("step discontinuity") or may cause non-uniformity in photoresist thickness in the photoresist coating process for photolithography. Thus, the recess is preferably less than 5 μm deep.

The conductive protective films 3 (including 3-1a, 3-1b, 3-2a, and 3-2b) are formed so as to cover the end surfaces (including 2-1a, 2-1b, 2-2a, and 2-2b) of the through wires 2 to prevent the end surfaces from being exposed therethrough. The conductive protective films 3 may be formed over the entire end surfaces and may not necessarily be formed on the surfaces 1a and 1b of the substrate 1. Alternatively, the conductive protective films 3 may be formed only on a portion of the end surfaces of the through wires 2, or may be formed so as to slightly extend to the surfaces 1a and 1b of the substrate 1. The conductive protective films 3 serve to prevent the end surfaces of the through wires 2 from being corroded by a reaction gas, a chemical, or the like. More specifically, the conductive protective films 3 are composed of a material having resistance to a reaction gas or chemical used in the process of manufacturing the CMUT. As described below, the conductive protective films 3 further serve to relay the electrical connection between one of the through wires 2 and a connection wire 10 and the electrical connection between the through wires 2 and electrode pads 11 and 12. Each of the conductive protective films 3 may be a single-layer film or a film of two or more layers. The conductive protective films 3 are composed mainly of a single metal or an alloy. For example, each of the conductive protective films 3 contains a metal such as Au, Ni, Ag, Pd, Fe, Cr, Nd, W, or Ti, or an alloy thereof. In a more specific example, each of the conductive protective films 3 is formed of a multilayer film made of Ni and Au, of which the outermost surface is a Au thin film. The thickness of the conductive protective films 3 has a lower limit in order to prevent the end surfaces of the through wires 2 from being corroded in the process of manufacturing the CMUT. By way of example, each of the conductive protective films 3 is formed of a multilayer film having a Ni thin film with a thickness of 0.2 μm and a Au thin film with a thickness of 0.1 μm. Further, the thickness of the conductive protective films 3 may be adjusted so as to be larger than the lower limit in accordance with the positional relationship between the end surfaces of the through wires 2 and the surfaces of the substrate 1. By way of example, in a case where the end surface 2-1a of the through wire 2-1 is recessed toward the inside of the substrate 1 from the surface (or the first surface 1a) of the substrate 1 by approximately 0.5 μm, the conductive protective film 3-1a may be formed of a multilayer film having a Ni thin film with a thickness of 0.4 μm and a Au thin film with a thickness of 0.1 μm to make the surface of the conductive protective film 3-1a flush with the first surface 1a of the substrate 1.

The conductive protective films 3 have preferably the following characteristics such as being resistant to a reaction gas or a chemical. For example, for the purpose of preventing corrosion during sacrificial layer etching, it is preferable that the etching speed of an etching solution be slower than that for the material of the through wires 2, or that the etching rate be 0.1 times or less that for the material of the through wires 2.

That is, in terms of "conductivity", it is desirable that a conductive protective film having a resistivity of $10^{-4}$ Ωm or less and made of a metal or a metal alloy be used. Further, preferable characteristic requirements for a conductive protective film in terms of "protection ability" are that the through wire material is covered so as not to be damaged at the time when the processing of all the films or structures, except the conductive protective film, is completed. That is, preferably, the conductive protective film still has a sufficient film thickness at the time when all the processing steps are completed, and serves to cover the through wire material to prevent the through wire material from being damaged. The thickness of the conductive protective film may be reduced in the processing step as long as the conductive protective film can protect the through wire material against damage. It is desirable that the conductive protective film have a thickness greater than or equal to the thickness of one atom layer or one molecular layer at the time when the processing step is completed. More specifically, the thickness of the conductive protective film is desirably greater than or equal to 0.01 μm.

The first electrode 4 is disposed on the first surface 1a side of the substrate 1. The first electrode 4 is formed of a metal thin film. The first electrode 4 may be disposed directly on a surface of the substrate 1 if the substrate 1 is insulating. Alternatively, the first electrode 4 may be disposed on the first surface 1a side of the substrate 1 using, as a base film, a metal film capable of close adhesion to both the first surface 1a of the substrate 1 and the conductive protective film 3-1a for an improvement in adhesion, electrical insulation, or the like. The first electrode 4 is connected to the through wire 2-1, which is one of the through wires 2, through the conductive protective film 3-1a, and is further connected to the electrode pad 11 on the second surface 1b side of the substrate 1 through the conductive protective film 3-1b. An insulating film may further be disposed on a surface of the first electrode 4 which is exposed to the gap 5, as necessary.

The area and height of the gap 5 are designed in accordance with the required performance of the capacitive transducer. When the capacitive transducer is driven, the gap 5 deforms in accordance with the vibration of the vibration film 9. For example, the gap 5 is a substantially cylindrical chamber with a diameter of 10 μm to 100 μm and a height of 50 nm to 500 nm. The second electrode 6 is disposed on the first surface 1a side of the substrate 1 in such a manner that the gap 5 is interposed between the second electrode 6 and the first electrode 4. The second electrode 6 is formed of a metal thin film. The second electrode 6 is held between the insulating film 7 and the insulating film 8 for electrical insulation. The second electrode 6 is connected to the through wire 2-2, which is one of the through wires 2, through the conductive protective film 3-2a using the connection wire 10, and is further connected to the electrode pad 12 on the second surface 1b side of the substrate 1 through the conductive protective film 3-2b. A portion of the connection wire 10 which is connected to the conductive protective film 3-2a is located such that at least a portion of the outer periphery of the connected portion of the connection wire 10 lies inside the outer periphery of the conductive protective film 3-2a. More desirably, the connected portion of the connection wire 10 is located completely within the conductive protective film 3-2a. This ensures that the second electrode 6 is connected to the through wire 2-2.

In addition to serving as insulating protective films of the second electrode 6, the insulating films 7 and 8 form the vibration film 9 of the cell together with the second electrode 6. The material and thickness of the insulating films 7 and 8 are designed in accordance with the required performance of the capacitive transducer. By way of example, the insulating films 7 and 8 are composed of silicon nitride, and have each a thickness of 100 nm to 1000 nm. The insulating film 7 and the insulating film 8 may be composed of different materials. Each of the insulating film 7 and the insulating film 8 may be a single-layer film or a multilayer film.

The vibration film 9, which is formed by the insulating film 7, the second electrode 6, and the insulating film 8, has desirably a tensile stress less than or equal to 1 GPa. If the vibration film 9 has compressive stress, the vibration film 9 may cause sticking or buckling, and may be largely deformed. Sticking is a situation where the vibration film 9 adheres to the first electrode 4 on the substrate 1. If the vibration film 9 has high tensile stress, the vibration film 9 may be likely to rupture. The material, film thickness, film deposition condition, and heat treatment condition of the insulating film 7, the second electrode 6, and the insulating film 8 are designed so that the vibration film 9 has a tensile stress less than or equal to 1 GPa. For improvements in inter-film adhesion and insulation, prevention of inter-diffusion, and the like in the insulating film 7, the second electrode 6, the insulating film 8, and the connection wire 10, a film having the effects described above may be disposed between films.

The capacitive transducer is connected to a control circuit, which is not illustrated. The connection may be performed via the electrode pads 11 and 12 using bump bonding, wire bonding, anisotropic conductive film (ACF) bonding, or the like. The capacitive transducer is driven by the application of a bias voltage to the first electrode 4 and by using the second electrode 6 as a signal application or extraction electrode, or vice versa.

As described above, the capacitive transducer according to this embodiment includes a through wire made mainly of a metal such as copper, and a conductive protective film on either end surface of the through wire. Accordingly, the through wire can be made of a low-resistance material. Also, the end surfaces of the through wire are less prone to corrosion in the process of manufacturing the capacitive transducer. Thus, the surface roughness and the reduction in the length of the through wire may be prevented or reduced in the manufacturing process, resulting in the through wire being electrically connected to lead wires (including a connection wire, an electrode pad, and so forth) with excellence and ease. The conductive protective films reduce limitations on the structural design of a device, achieving an improvement in manufacturing yield. In addition, the performance of the capacitive transducer can be maintained. A through-wiring substrate used for the capacitive transducer described above may also be applied to devices other than a capacitive transducer, such as semiconductor devices. Examples of such semiconductor devices include various Micro-Electro-Mechanical System (MEMS) devices.

Second Embodiment

Figure 2A:
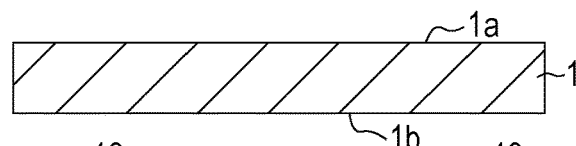
FIGS. 2A to 2O are diagrams illustrating a method for manufacturing a capacitive transducer according to a second embodiment of the present invention.

An example of a method for manufacturing a capacitive transducer according to a second embodiment of the present invention will be described with reference to FIGS. 2A to 2O. FIGS. 2A to 2O are cross-sectional views illustrating a method for manufacturing a capacitive transducer according to this embodiment. In FIGS. 2A to 2O, only one cell (i.e., one vibration film) of a capacitive transducer is also illustrated, for simplicity.

First, as illustrated in FIG. 2A, a substrate 1 having a first surface 1a and a second surface 1b located opposite the first surface 1a is prepared. The material of the substrate 1 is selected in accordance with the required performance of the capacitive transducer. For example, the substrate 1 is composed of an insulating material such as glass, or is composed of high-resistance silicon, low-resistance silicon, or the like. In the following, the substrate 1 is composed of low-resistance silicon, by way of example. The substrate 1 has a thickness of, for example, 100 μm to 1000 μm. For a reduction in the variation in performance across cells, the first surface 1a of the substrate 1 is desirably flat and smooth. For example, the first surface 1a of the substrate 1 has a surface roughness Ra (or arithmetic mean roughness) satisfying Ra<10 nm.

Figure 2B:
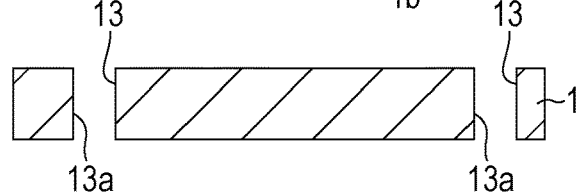

Then, as illustrated in FIG. 2B, through holes 13 are formed in the substrate 1 so as to extend through the substrate 1 between the first surface 1a and the second surface 1b. The through holes 13 serve as holes through which predetermined through wires (or through electrodes) 2 extend. Each of the through holes 13 may have a uniform or non-uniform cross section in the lengthwise direction thereof. By way of example, each of the through holes 13 has a substantially circular cross section, and has a diameter of 5 μm to 100 μm. The through holes 13 are processed using, for example, deep reactive-ion etching (RIE) of silicon. Both the first surface 1a and the second surface 1b of the substrate 1 are subjected to RIE processing as necessary. Also, inner walls 13a of the through holes 13 are smoothed as necessary. The smoothing of the inner walls 13a is implemented by, for example, forming a silicon oxide film on the surfaces of the inner walls 13a by thermal oxidation and then removing the silicon oxide film by a chemical such as hydrofluoric acid or buffered hydrofluoric acid (BHF). A heat treatment under hydrogen atmosphere would also be effective for the smoothing of the inner walls 13a. The number of through holes 13 corresponds to the number of through wires 2. A pre-formed substrate with a through hole formed therein may be prepared.

Figure 2C:
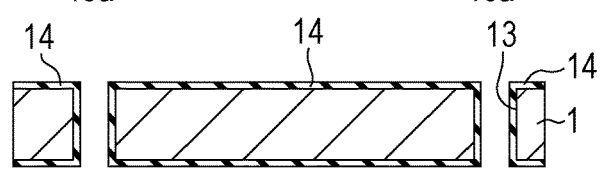

Then, as illustrated in FIG. 2C, an insulating film 14 is formed on surfaces of the substrate 1 including the first surface 1a, the second surface 1b, and the inner walls 13a of the through holes 13 (see FIG. 2B). The insulating film 14 is composed of, for example, silicon oxide, silicon nitride, aluminum oxide ($Al_2O_3$), or the like, and desirably has high insulation. The thickness of the insulating film 14 is determined in accordance with the desired dielectric strength and the characteristics of the material to be used. For example, the thickness of the insulating film 14 ranges from 0.1 μm to 2 μm. Examples of the method for forming the insulating film 14 include thermal oxidation, chemical vapor deposition (CVD), and atomic layer deposition (ALD). The insulating film 14 may be a single-layer film or a multilayer film. An adhesion layer may be formed between the surfaces of the substrate 1 and the insulating film 14, as necessary. Also in this stage, a pre-formed substrate having the structure described above may be prepared.

Figure 2D:
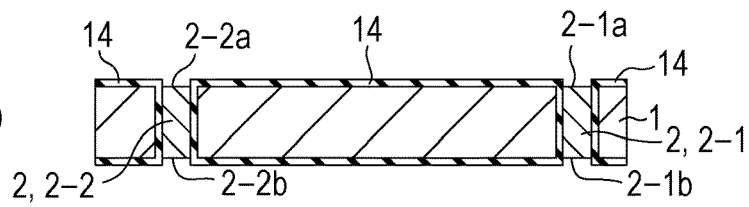

Then, as illustrated in FIG. 2D, through wires 2 (including 2-1 and 2-2) are formed in the through holes 13 (see FIG. 2C), extending through the substrate 1 between the first surface 1a of the substrate 1 and the second surface 1b located opposite the first surface 1a. The through wires 2 are composed of a low-resistivity material. The through wires 2 are desirably composed of a material containing a metal. For example, the through wires 2 have a structure containing Cu as a main component. The through wires 2 are formed in such a manner that the through holes 13 are substantially filled with the through wires 2. Examples of the method for forming the through wires 2 include metal plating. In particular, it is preferable that a surface of the substrate 1 (for example, the second surface 1b of the substrate 1) be bonded to a seed-layer-coated substrate, and then subjected to electroplating. After the plating process, the first surface 1a and the second surface 1b of the substrate 1 are polished for planarization. A preferable method for polishing is chemical mechanical polishing (CMP). The surface roughness Ra of the first surface 1a of the substrate 1 is reduced by CMP to satisfy Ra<10 nm. After CMP, the end surfaces of the through wires 2 are recessed toward the inside of the substrate 1 from the surfaces of the substrate 1. For example, the end surfaces 2-1a and 2-a of the through wires 2 on the first surface 1a side of the substrate 1 are recessed toward the inside of the substrate 1 from the surface of the insulating film 14 by approximately 0.1 μm to 5 μm. Also, the end surfaces 2-1b and 2-2b of the through wires 2 on the second surface 1b side of the substrate 1 are recessed toward the inside of the substrate 1 from the surface of the insulating film 14 by approximately 0.1 μm to 5 μm. At least two through wires 2 are formed for each element including a plurality of vibration films (or cells).

Figure 2E:
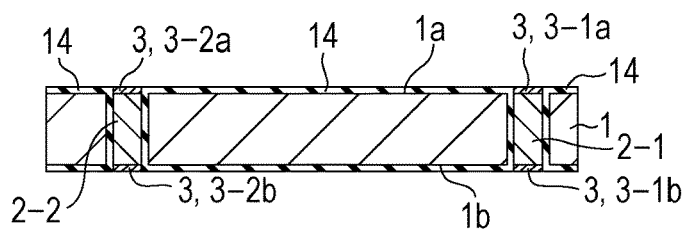

Then, as illustrated in FIG. 2E, conductive protective films 3 (including 3-1a, 3-1b, 3-2a, and 3-2b) are formed on the end surfaces (including 2-1a, 2-1b, 2-2a, and 2-2b) of the through wires 2. The conductive protective films 3 are formed so as to cover the entire end surfaces of the through wires 2 to prevent the end surfaces from being exposed therethrough. The conductive protective films 3 may be formed only on the end surfaces of the through wires 2, and may not necessarily be formed on the surfaces 1a and 1b of the substrate 1. The conductive protective films 3 are composed mainly of a single metal or an alloy. For example, the conductive protective films 3 contain a metal such as Au, Ni, Ag, Pd, Fe, Cr, Nd, W, or Ti, or an alloy thereof.

In a more specific example, each of the conductive protective films 3 is formed of a multilayer film made of Ni and Au, of which the outermost surface is a thin film of Au. The lower limit of the thickness of the conductive protective films 3 is determined so that the end surfaces of the through wires 2 are not corroded in the process of manufacturing the CMUT. The thickness of the conductive protective films 3 may be larger than the lower limit in accordance with the positional relationship between the end surfaces of the through wires 2 and the surfaces of the substrate 1. By way of example, in a case where the end surface 2-1a of the through wire 2 on the first surface 1a side of the substrate 1 is recessed toward the inside of the substrate 1 from the surface of the insulating film 14 by approximately 0.5 μm, the conductive protective film 3-1a is formed of a multilayer film having a Ni thin film with a thickness of approximately 0.4 μm and a Au thin film with a thickness of approximately 0.1 μm. This makes the surface of the conductive protective film 3-1a on the first surface 1a side of the substrate 1 flush with the surface of the insulating film 14. The conductive protective films 3 are formed by, for example, electroless plating. The electroless plating enables the conductive protective films 3 (including 3-1a, 3-1b, 3-2a, and 3-2b) to be formed simultaneously on all the end surfaces (including 2-1a, 2-1b, 2-2a, and 2-2b) of the through wires 2. The thickness of a plating film is controlled in accordance with the plating condition and the plating time. After the plating process, the thickness and surface planarity of the conductive protective films 3 are adjusted using CMP as necessary.

Figure 2F:
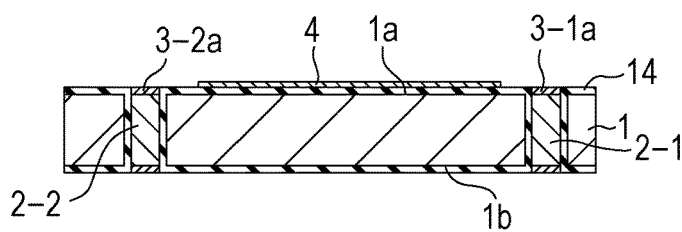

Then, as illustrated in FIG. 2F, a first electrode 4 is formed on the first surface 1a side of the substrate 1. The first electrode 4 is one of the electrodes for driving a vibration film 9 (see FIG. 2O). Since the first electrode 4 is formed on top of the insulating film 14, the first electrode 4 is insulated from the substrate 1. The first electrode 4 is located below a vibrating portion of the vibration film 9 (a portion corresponding to the gap 5 in FIG. 2O) of the cell, and extends around more than the vibrating portion of the vibration film 9. The first electrode 4 is composed of a material with high conductivity. For example, the first electrode 4 is formed of a film containing a metal as a main component. The first electrode 4 may be a single-layer film or a film of a plurality of layers. By way of example, the first electrode 4 is formed by a stack of a Ti film with a thickness of approximately 10 nm and a W film with a thickness of approximately 50 nm. The first electrode 4 is formed so that cells in the same element are in electrical continuity. The first electrode 4 may be formed using a method including metal film deposition, photolithography, and metal dry etching or wet etching.

Figure 2G:
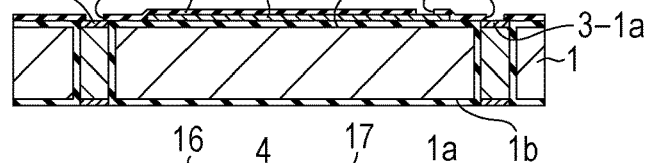

Then, as illustrated in FIG. 2G, an insulating film 16 is formed. The insulating film 16 is formed so as to cover a surface of the first electrode 4, and one of its roles is to act as an insulating protective film of the first electrode 4. For example, the insulating film 16 is a high-insulation film composed of any one or two or more materials of silicon oxide, silicon nitride, and aluminum oxide ($Al_2O_3$). The thickness of the insulating film 16 is determined in accordance with the desired dielectric strength and the characteristics of the material or materials, and ranges from, for example, 0.1 μm to 2 μm. The insulating film 16 is desirably formed at a temperature less than or equal to 400° C. Examples of the method for forming the insulating film 16 include chemical vapor deposition, atomic layer deposition, vacuum deposition, and sputter deposition. The insulating film 16 may be a single-layer film or a multilayer film. An adhesion layer may be formed under the insulating film 16, as necessary. The insulating film 16 has openings 16a, 16b, and 16c. The opening 16a allows a portion of a surface of the conductive protective film 3-2a to be exposed. The opening 16b allows a portion of a surface of the conductive protective film 3-1a to be exposed. The opening 16c allows a portion of a surface of the first electrode 4 to be exposed. The openings 16a, 16b, and 16c may be formed using a method including the formation of an etching mask using photolithography, and dry etching including reactive-ion etching or wet etching using chemicals.

Figure 2H:
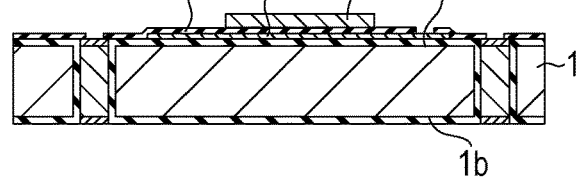

Then, as illustrated in FIG. 2H, a sacrificial layer 17 is formed. The sacrificial layer 17 is a temporary structure for forming the gap 5 (see FIG. 2O) of the cell, and is composed of a material that is selectively removable in the process of forming the gap 5. The sacrificial layer 17 is composed of, for example, a silicon-based material or a metal such as Cr. The pattern of the sacrificial layer 17 may be formed using a method including film formation, the formation of an etching mask using photolithography, and dry etching or wet etching using chemicals.

Figure 2I:
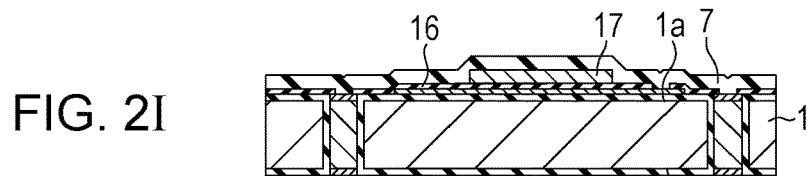

Then, as illustrated in FIG. 2I, an insulating film 7 is formed. The insulating film 7 is formed so as to be stretched over a bottom surface of a second electrode 6 (see FIG. 2J), and one of its roles is to act as an insulating protective film of the second electrode 6. For example, the insulating film 7 is a high-insulation film composed of any one or two or more materials of silicon oxide, silicon nitride, and aluminum oxide ($Al_2O_3$). The thickness of the insulating film 7 is determined in accordance with the desired dielectric strength and the characteristics of the material or materials, and ranges from, for example, 0.1 µm to 2 µm. The insulating film 7 is desirably formed at a temperature less than or equal to 400° C. Examples of the method for forming the insulating film 7 include chemical vapor deposition, atomic layer deposition, and sputtering. The insulating film 7 may be a single-layer film or a multilayer film.

Figure 2J:
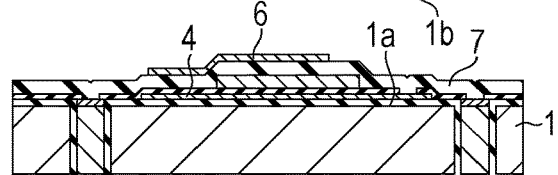

Then, as illustrated in FIG. 2J, the second electrode 6 is formed. The second electrode 6 is formed in a vibration film 9 (see FIG. 2O) so as to face the first electrode 4, and one of the electrodes for driving the vibration film 9. The second electrode 6 has a material configuration similar to the first electrode 4, and may be formed using a method similar to that for the first electrode 4. By way of example, the second electrode 6 is formed by a stack of a Ti film with a thickness of approximately 10 nm and an Al—Nd alloy film with a thickness of approximately 100 nm. Further, the second electrode 6 is formed so that cells in the same element are in electrical continuity.

Figure 2K:
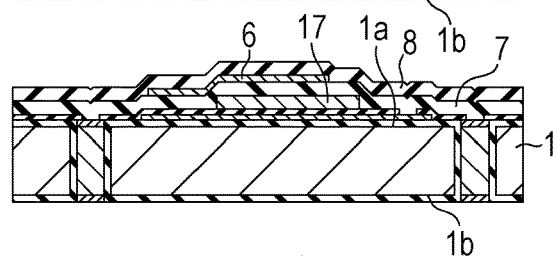

Then, as illustrated in FIG. 2K, an insulating film 8 is formed. The insulating film 8 is formed so as to cover a top surface of the second electrode 6, and one of its roles is to act as an insulating protective film of the second electrode 6. The insulating film 8 is desirably formed at a temperature less than or equal to 400° C. The insulating film 8 has a material configuration similar to the insulating film 7, and may be formed using a method similar to that for the insulating film 7.

Figure 2L:
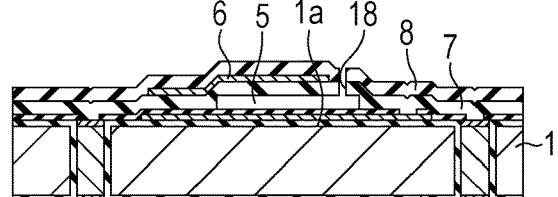

Then, as illustrated in FIG. 2L, an etch hole 18 is formed, and the sacrificial layer 17 (see FIG. 2K) is removed. The etch hole 18 is an opening which extends through the insulating films 7 and 8 and through which the sacrificial layer 17 is etched. The etch hole 18 may be formed using a method including the formation of an etching mask using photolithography, and dry etching including reactive-ion etching or wet etching using chemicals. The sacrificial layer 17 is removed through the etch hole 18 using an etching solution or an etching gas. After the removal of the sacrificial layer 17, a gap 5 is formed.

Figure 2M:
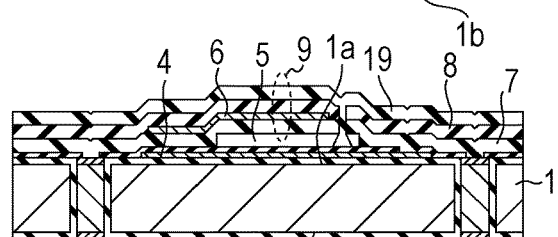

Then, as illustrated in FIG. 2M, a thin film 19 is formed, and the etch hole 18 (see FIG. 2L) is sealed. The thin film 19 serves to seal the etch hole 18, and also forms a vibration film 9, which is capable of vibrating, above the gap 5 together with the insulating film 7, the second electrode 6, and the insulating film 8. The thin film 19 seals the etch hole 18 with excellence, and the material, thickness, and the like of the thin film 19 are determined in accordance with the desired performance of the vibration film 9. The thin film 19 is desirably formed at a temperature less than or equal to 400° C. The thin film 19, which is an insulating film, has a material configuration similar to the insulating film 7, and may be formed using a method similar to that for the insulating film 7. The material, film thickness, film deposition condition, and heat treatment condition of the insulating film 7, the second electrode 6, the insulating film 8, and the thin film 19 are comprehensively designed so that the vibration film 9 formed by the insulating film 7, the second electrode 6, the insulating film 8, and the thin film 19 has a tensile stress less than or equal to 1 GPa for the reasons described above.

Figure 2N:
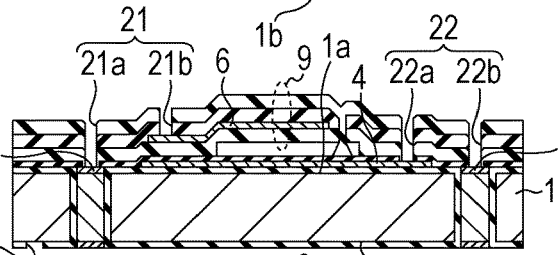
Figure 2O:
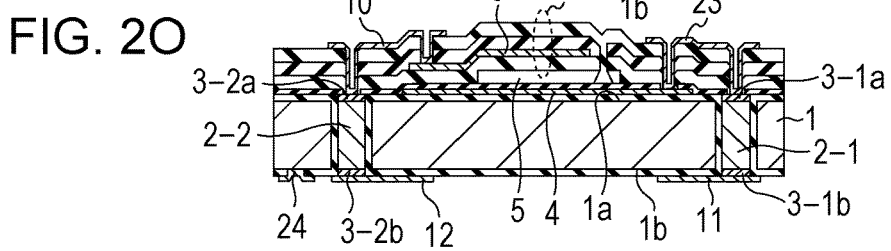

Then, as illustrated in FIG. 2N, contact holes 20, 21 (including 21a and 21b), and 22 (including 22a and 22b) for electrical connection are formed. The contact hole 20 is an opening which is formed on the second surface 1b side of the substrate 1 and from which a portion of the second surface 1b of the substrate 1 is exposed. The contact holes 21 and 22 are formed on the first surface 1a side of the substrate 1. The contact hole 21a is an opening from which a portion of a surface of the conductive protective film 3-2a is exposed, and the contact hole 21b is an opening from which a portion of a surface of the second electrode 6 is exposed. The contact hole 22a is an opening from which a portion of a surface of the first electrode 4 is exposed, and the contact hole 22b is an opening from which a portion of a surface of the conductive protective film 3-1a is exposed. The contact hole 21a is located such that at least a portion of the outer periphery thereof lies inside the conductive protective film 3-2a. More desirably, the contact hole 21a is located completely within the conductive protective film 3-2a. Also, the contact hole 22b is located such that at least a portion of the outer periphery thereof lies inside the conductive protective film 3-1a. More desirably, the contact hole 22b is located completely within the conductive protective film 3-1a. The contact holes 20, 21, and 22 may be formed using a method including the formation of an etching mask using photolithography, and dry etching including reactive-ion etching or wet etching using chemicals.

Then, as illustrated in FIG. 2O, connection wires 10 and 23 and electrode pads 11, 12, and 24 are formed. The connection wires 10 and 23 are formed on the first surface 1a side of the substrate 1. The connection wire 10 connects the second electrode 6 to the conductive protective film 3-2a on one of the end surfaces of the through wire 2-2 through the contact holes 21 (including 21a and 21b) (see FIG. 2N). The connection wire 23 connects the first electrode 4 to the conductive protective film 3-1a on one of the end surfaces of the through wire 2-1 through the contact holes 22 (including 22a and 22b) (see FIG. 2N). The electrode pads 11, 12, and 24 are formed on the second surface 1b side of the substrate 1. The electrode pad 11 is formed so as to be connected to the conductive protective film 3-1b on the other end surface of the through wire 2-1. The electrode pad 12 is formed so as to be connected to the conductive protective film 3-2b on the other end surface of the through wire 2-2. As a result, the first electrode 4 on the first surface 1a side of the substrate 1 is led to the opposite second surface 1b side of the substrate 1 through the through wire 2-1. Also, the second electrode 6 on the first surface 1a side of the substrate 1 is led to the opposite second surface 1b side of the substrate 1 through the through wire 2-2. The electrode pad 24 is formed so as to be connected to the substrate 1. The connection wires 10 and 23 and the electrode pads 11, 12, and 24 are made mainly of a metal, and may be formed using a method similar to that for the first electrode 4.

In the second embodiment described above, in FIGS. 2A to 2O, a through wire is formed, and conductive protective films are formed on the front and rear sides of the through wire. Alternatively, the following configuration may be used: an electrode pad is formed directly on the rear side of the through wire, and then a conductive protective film is formed over the electrode pad. That is, an example is also possible in which, prior to the formation of a cell, the steps of forming an electrode pad directly on the rear side of a through wire and then forming conductive protective films on the front and rear sides of the through wire is provided. In this regard, measures should be taken for the following points.

(1) If the electrode pad is made of a material different from that of the through wire, the electrode pad might not be plated with a conductive protective film when the through wire is plated with a conductive protective film.
(2) Pad formation followed by a cell forming process might cause the material of the electrode pad to be diffused into the insulating film on the rear surface of the substrate due to heat, resulting in deterioration in insulation resistance. Therefore, measures should be taken to suppress the deterioration in insulation resistance.

In the manufacturing process illustrated in FIGS. 2C to 2O described above, for improvements in inter-film adhesion and insulation, prevention of inter-diffusion, and the like, a film having the effects described above may be disposed between films. It is also effective to perform a surface treatment on an underlying film prior to the deposition of an upper film in order to improve adhesion between films. The surface treatment cleans or activates the surface of the underlying film. Examples of the surface treatment include a plasma treatment and a chemical-based treatment.

Then, the capacitive transducer is connected to a control circuit, which is not illustrated. The connection is performed via the electrode pads 11, 12, and 24. Examples of the connection include direct metal bonding, bump bonding, ACF bonding, and wire bonding. The capacitive transducer is driven by the application of a bias voltage to the first electrode 4 and by using the second electrode 6 as a signal application or extraction electrode, or vice versa. The substrate 1 is grounded via the electrode pad 24, resulting in a reduction in signal noise. This embodiment may also achieve advantages similar to those of the first embodiment.

In the following, more specific examples will be described.

First Example

FIG. 1 is a cross-sectional view of a first example of a capacitive transducer. Only one cell (or one vibration film) of the capacitive transducer is illustrated.

As illustrated in FIG. 1, the capacitive transducer according to this example includes a cell having the structure described above in the first embodiment, in which conductive protective films 3 (including 3-1a, 3-1b, 3-2a, and 3-2b) are formed. In this example, the substrate 1 is formed of an insulating glass substrate whose both surfaces are mirror-polished, and has a surface roughness Ra satisfying Ra<5 nm. The substrate 1 has a thickness of 180 μm. Each of through wires 2 (including 2-1 and 2-2) has a substantially cylindrical structure made mainly of Cu, and has ends on the first surface 1a and the second surface 1b of the substrate 1, the diameter of which is approximately 30 μm. The through wires 2 have end surfaces 2-1a and 2-2a on the first surface 1a side of the substrate 1 which are recessed toward the inside of the substrate 1 from the first surface 1a of the substrate 1 by approximately 0.5 μm. The through wires 2 also have end surfaces 2-1b and 2-2b on the second surface 1b side of the substrate 1 which are recessed toward the inside of the substrate 1 by approximately 0.5 μm from the second surface 1b.

Conductive protective films 3 are formed so as to cover the respective end surfaces of the through wires 2, and are formed only on the end surfaces of the through wires 2. The conductive protective films 3 are each formed of a multi-layer film having a Ni layer with a thickness of approximately 0.4 μm and a Au layer with a thickness of approximately 0.1 μm, of which the outermost surface is a thin film of Au. The surfaces of the conductive protective films 3-1a and 3-2a are substantially flush with the first surface 1a of the substrate 1. The surfaces of the conductive protective films 3-1b and 3-2b are also substantially flush with the second surface 1b of the substrate 1.

The first electrode 4 is formed on the first surface 1a side of the substrate 1, and covers the entirety of the bottom portion of a gap 5. The first electrode 4 is connected to the through wire 2-1 through the conductive protective film 3-1a, and is further electrically connected to an electrode pad 11 on the second surface 1b side of the substrate 1 through the conductive protective film 3-1b. A 10-nm Ti film and a 50-nm W film are disposed in sequence on the first surface 1a of the substrate 1 to form the first electrode 4. The Ti film mainly serves to improve adhesion between the first electrode 4 and the first surface 1a of the substrate 1. The gap 5 is a cylindrical chamber with a diameter of approximately 30 μm and a height (or thickness) of approximately 150 nm.

A second electrode 6 is disposed on the first surface 1a side of the substrate 1 in such a manner that the gap 5 is interposed between the second electrode 6 and the first electrode 4. The second electrode 6 is formed so as to be held between an insulating film 7 and an insulating film 8 for electrical insulation. The second electrode 6 is connected to the through wire 2-2 through the conductive protective film 3-2a using a connection wire 10, and is further electrically connected to an electrode pad 12 on the second surface 1b side of the substrate 1 through the conductive protective film 3-2b. A portion of the connection wire 10 which is connected to the conductive protective film 3-2a is located completely within the conductive protective film 3-2a, ensuring the connection between the second electrode 6 and the through wire 2-2. The second electrode 6 is formed by a stack of a 10-nm Ti film and a 100-nm Al—Nd alloy film in this order. The Ti film mainly serves to improve adhesion between the second electrode 6 and the insulating film 7 and to prevent inter-diffusion.

In addition to serving as insulating protective films of the second electrode 6, the insulating film 7 and the insulating film 8 form a vibration film 9 of the cell together with the second electrode 6. The insulating films 7 and 8 are composed of silicon nitride. The insulating film 7 has a thickness of approximately 400 nm, and the insulating film 8 has a thickness of approximately 1 μm. The vibration film 9, which is formed by the insulating film 7, the second electrode 6, and the insulating film 8, has a tensile stress less than or equal to 0.7 GPa. The connection wire 10 is formed by a stack of a Ti film with a thickness of 10 nm and an Al film with a thickness of 500 nm in this order. The Ti film mainly serves to improve adhesion between the connection wire 10 and each of the insulating film 7, the insulating film 8, and the conductive protective film 3-2a, and to prevent interdiffusion. The electrode pads 11 and 12 are Al films with a thickness of approximately 500 nm.

The capacitive transducer is connected to a control circuit, which is not illustrated. The connection is performed via the electrode pads 11 and 12 using ACF bonding. The capacitive transducer is driven by the application of a bias voltage to the first electrode 4 and by using the second electrode 6 as a signal application or extraction electrode.

As described above, the capacitive transducer according to this example includes a through wire made mainly of Cu, and conductive protective films on end surfaces of the through wire which is composed of Au/Ni. Accordingly, the through wire is made of a low-resistance material. Also, corrosion of the end surfaces of the through wire is avoided in the manufacturing process. This results in reliable and low-resistance connection among an electrode, the through wire, and lead wires (including a connection wire and an electrode pad). The conductive protective films reduce limitations on the structural design of a device, achieving an improvement in manufacturing yield. In addition, the performance of the capacitive transducer can be maintained.

Second Example

In a second example, a more specific example of a method for manufacturing a capacitive transducer according to an embodiment of the present invention will be described with reference to the cross-sectional view illustrated in FIGS. 2A to 2O.

First, as illustrated in FIG. 2A, a substrate 1 having a first surface 1a and a second surface 1b located opposite the first surface 1a is prepared. The substrate 1 is formed of a low-resistance silicon substrate whose both surfaces are mirror-polished, and has a surface roughness Ra satisfying Ra<2 nm and a resistivity of approximately 0.01 Ω·cm. The substrate 1 has a thickness of 200 µm. Then, as illustrated in FIG. 2B, through holes 13 are formed in the substrate 1 so as to extend through the substrate 1 between the first surface 1a of the substrate 1 and the second surface 1b located opposite the first surface 1a. The through holes 13 have a substantially cylindrical shape, and have openings in the first surface 1a and the second surface 1b of the substrate 1, the openings having a diameter of approximately 20 µm. The through holes 13 are processed using Deep RIE technology of silicon. After the Deep RIE process, inner walls 13a of the through holes 13 are smoothed. The smoothing of the inner walls 13a is implemented by repeating the thermal oxidation of the surface of the substrate 1 composed of silicon and the removal of the thermal oxide film twice.

Then, as illustrated in FIG. 2C, an insulating film 14 is formed on surfaces of the substrate 1 including the first surface 1a and the second surface 1b of the substrate 1 and the inner walls 13a of the through hole 13. The insulating film 14 is a silicon oxide film with a thickness of approximately 1 µm, and is formed by thermal oxidation of silicon. Then, as illustrated in FIG. 2D, through wires 2 are formed in the through holes 13, extending through the substrate 1 between the first surface 1a of the substrate 1 and the second surface 1b located opposite the first surface 1a. The through wires 2 are made mainly of Cu. The through wires 2 are formed using electroplating and polishing technology. Specifically, first, the second surface 1b of the substrate 1 is brought into close adhesion with a seed-layer-coated substrate (not illustrated) to perform electroplating of Cu. After the plating process, the seed-layer-coated substrate is removed. Then, the first surface 1a and the second surface 1b of the substrate 1 are each subjected to Cu CMP. Through CMP, the end surfaces of the through wires 2 are recessed toward the inside of the substrate 1 from the surfaces of the substrate 1 by approximately 0.5 µm. That is, the end surfaces 2-1a and 2-2a of the through wires 2 on the first surface 1a side of the substrate 1 are recessed toward the inside of the substrate 1 from the surface of the insulating film 14 by approximately 0.5 µm. Also, the end surfaces 2-1b and 2-2b of the through wires 2 on the second surface 1b side of the substrate 1 are recessed toward the inside of the substrate 1 from the surface of the insulating film 14 by approximately 0.5 µm. In FIG. 2D, two through wires 2 appear to be formed for each vibration film (or each cell); in actuality, two through wires 2 are formed for each element including a plurality of vibration films. The number of through wires 2 corresponds to the number of through holes 13.

Then, as illustrated in FIG. 2E, conductive protective films 3 (including 3-1a, 3-1b, 3-2a, and 3-2b) are formed on the end surfaces (including 2-1a, 2-1b, 2-2a, and 2-2b) of the through wires 2. The conductive protective films 3 are formed only on the end surfaces of the through wires 2 to cover the end surfaces of the through wires 2 so that the end surfaces of the through wires 2 are not exposed. The conductive protective films 3 are each formed of a multilayer film having a Ni thin film with a thickness of approximately 0.4 µm and a Au thin film with a thickness of approximately 0.1 µm, of which the outermost surface is a thin film of Au. Accordingly, the surfaces of the conductive protective films 3 on the first surface 1a side and the second surface 1b side of the substrate 1 are made substantially flush with the surface of the insulating film 14. The conductive protective films 3 are formed by stacking a Ni film and a Au film in this order using electroless plating. Prior to Ni plating, the end surfaces of the through wires 2 are subjected to cleaning, and then fine particles of Pd are applied to only the surface of Cu. The fine particles of Pd serve as nuclei of Ni plating. The plating process is performed simultaneously on all the end surfaces (including 2-1a, 2-1b, 2-2a, and 2-2b) of the through wires 2. The thickness of the plating films is controlled in accordance with the plating condition and the plating time. After the plating process, the thickness and surface planarity of the conductive protective films 3 are adjusted using CMP, as necessary. In particular, the adjustment of the shape and thickness of a Ni film by CMP after Ni plating may facilitate the control of the overall shape and thickness of the conductive protective films 3.

Then, as illustrated in FIG. 2F, a first electrode 4 is formed on the first surface 1a side of the substrate 1. The first electrode 4 is one of the electrodes for driving a vibration film 9. The first electrode 4 is formed on top of the insulating film 14, and is thus insulated from the substrate 1. The first electrode 4 is located below a vibrating portion of the vibration film 9 (a portion corresponding to a gap 5 in FIG. 2O) of the cell, and extends around more than the vibrating portion of the vibration film 9. The first electrode 4 is formed so that cells in the same element are in electrical continuity. The first electrode 4 is formed by a stack of a Ti film with a thickness of approximately 10 nm and a W film with a thickness of approximately 50 nm. The first electrode 4 is formed using a method including metal film deposition, the formation of an etching mask using photolithography, and metal etching.

Then, as illustrated in FIG. 2G, an insulating film 16 is formed. The insulating film 16 is formed so as to cover the surface of the first electrode 4, and one of its roles is to act as an insulating protective film of the first electrode 4. The insulating film 16 is a silicon oxide film with a thickness of 200 nm. The silicon oxide film is formed at a substrate temperature of approximately 300° C. using the CVD method. After the deposition of the silicon oxide film, openings 16*a*, 16*b*, and 16*c* are formed in the insulating film 16. The openings 16*a*, 16*b*, and 16*c* are formed using a method including the formation of an etching mask using photolithography and dry etching including reactive-ion etching.

Then, as illustrated in FIG. 2H, a sacrificial layer 17 is formed. The sacrificial layer 17 is used to form a gap 5 in the cell, and is composed of Cr. First, a Cr film with a thickness of 150 nm is formed on the first surface 1*a* of the substrate 1 using electron beam vapor deposition. Then, the Cr film is processed into a desired shape using a method including photolithography and wet etching. The sacrificial layer 17 has a cylindrical structure having a diameter of approximately 30 μm and a height of approximately 150 nm, and has a structure with which an etch hole 18 (see FIG. 2L) communicates in the subsequent step.

Then, as illustrated in FIG. 2I, an insulating film 7 is formed. The insulating film 7 is formed so as to come into contact with a bottom surface of the second electrode 6, and one of its roles is to act as an insulating protective film of the second electrode 6. The insulating film 7 is a silicon nitride film with a thickness of 400 nm. The silicon nitride film is deposited at a substrate temperature of approximately 300° C. using plasma enhanced CVD (PE-CVD). During film deposition, the flow amount of deposition gas and the like are controlled so that the silicon nitride film, which becomes the insulating film 7, has a tensile stress of approximately 0.1 GPa.

Then, as illustrated in FIG. 2J, a second electrode 6 is formed. The second electrode 6 is formed on a vibration film so as to face the first electrode 4, and is one of the electrodes for driving the vibration film 9. The second electrode 6 is formed by a stack of a 10-nm Ti film and a 100-nm Al—Nd alloy film in this order. The second electrode 6 is formed using a method including metal sputter deposition, the formation of an etching mask using photolithography, and metal etching. The film deposition condition is adjusted so that the second electrode 6 has a tensile stress less than or equal to 0.4 GPa at the time when the manufacture of the capacitive transducer is completed. The second electrode 6 is formed so that cells in the same element are in electrical continuity.

Then, as illustrated in FIG. 2K, an insulating film 8 is formed. The insulating film 8 is formed so as to cover a top surface of the second electrode 6, and one of its roles is to act as an insulating protective film of the second electrode 6. The insulating film 8 has a configuration similar to the insulating film 7, and is formed using a method similar to that for the insulating film 7.

Then, as illustrated in FIG. 2L, an etch hole 18 is formed to remove the sacrificial layer 17. The etch hole 18 is formed using a method including photolithography and reactive-ion etching. Then, an etching solution is introduced through the etch hole 18 to remove the sacrificial layer 17 composed of Cr. Accordingly, the gap 5 having the same shape as the sacrificial layer 17 is formed.

Then, as illustrated in FIG. 2M, a thin film 19 is formed. The thin film 19 seals the etch hole 18, and also form a vibration film 9, which is capable of vibrating, above the gap 5 together with the insulating film 7, the second electrode 6, and the insulating film 8. The thin film 19 is a silicon nitride film with a thickness of 500 nm. Similarly to the insulating film 7, the thin film 19 is deposited at a substrate temperature of approximately 300° C. using PE-CVD. The vibration film 9 formed in the manner described above has a tensile stress of approximately 0.7 GPa as a whole, and has a rupture-resistant structure that is free of sticking or buckling.

Then, as illustrated in FIG. 2N, contact holes 20, 21 (including 21*a* and 21*b*), and 22 (including 22*a* and 22*b*) for electrical connection are formed. The contact hole 20 is an opening which is formed on the second surface 1*b* side of the substrate 1 and from which a portion of the second surface 1*b* of the substrate 1 is exposed. The contact holes 21 and 22 are formed on the first surface 1*a* side of the substrate 1. The contact hole 21*a* is an opening from which a portion of a surface of the conductive protective film 3-2*a* is exposed, and the contact hole 21*b* is an opening from which a portion of a surface of the second electrode 6 is exposed. The contact hole 22*a* is an opening from which a portion of a surface of the first electrode 4 is exposed, and the contact hole 22*b* is an opening from which a portion of a surface of the conductive protective film 3-1*a* is exposed. The contact hole 21*a* is located such that the outer periphery thereof lies inside the conductive protective film 3-2*a*. Also, the contact hole 22*b* is located such that the outer periphery thereof lies inside the conductive protective film 3-1*a*. The contact hole 20 is formed using a method including the formation of an etching mask using photolithography and silicon oxide etching with buffered hydrofluoric acid. The contact holes 21 and 22 are formed using a method including the formation of an etching mask using photolithography and reactive-ion etching of silicon nitride. The contact holes 20, 21, and 22 have a cylindrical shape with a diameter of, for example, approximately 10 μm.

Then, as illustrated in FIG. 2O, connection wires 10 and 23 and electrode pads 11, 12, and 24 are formed. The connection wires 10 and 23 are formed on the first surface 1*a* side of the substrate 1, and are formed by stacking a Ti film with a thickness of 10 nm and an Al film with a thickness of 500 nm in this order. The connection wire 10 connects the second electrode 6 to the conductive protective film 3-2*a* on one of the end surfaces of the through wire 2-2 through the contact holes 21 (including 21*a* and 21*b*) (see FIG. 2N). The connection wire 23 connects the first electrode 4 to the conductive protective film 3-1*a* on one of the end surfaces of the through wire 2-1 through the contact holes 22 (including 22*a* and 22*b*) (see FIG. 2N). The electrode pads 11, 12, and 24 are formed on the second surface 1*b* side of the substrate 1, and are each formed of an Al film with a thickness of approximately 500 nm. The electrode pad 11 is formed so as to be connected to the conductive protective film 3-1*b* on the other end surface of the through wire 2-1. The electrode pad 12 is formed so as to be connected to the conductive protective film 3-2*b* on the other end surface of the through wire 2-2. As a result, the first electrode 4 on the first surface 1*a* side of the substrate 1 is led to the opposite second surface 1*b* side of the substrate 1 through the through wire 2-1. Also, the second electrode 6 on the first surface 1*a* side of the substrate 1 is led to the opposite second surface 1*b* side of the substrate 1 through the through wire 2-2. The electrode pad 24 is formed so as to be connected to the substrate 1.

In the manufacturing process described above, prior to the deposition of an upper film, a plasma treatment may be performed on a surface of a lower film to improve inter-film adhesion between the insulating films 7, 8, and 9. The plasma treatment cleans or activates the surface of the lower film.

Figure 3:
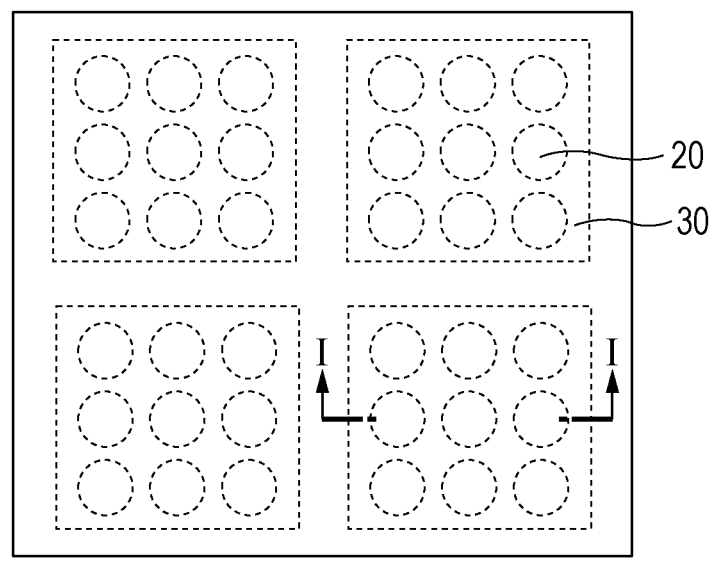
FIG. 3 is a top view of the capacitive transducer according to the embodiments of the present invention.

Then, the capacitive transducer is connected to a control circuit. The connection is performed via the electrode pads 11, 12, and 24. ACF bonding is used for connection. A cell is formed by the manufacturing method described above. In actuality, multiple cells 20 are arranged in a manner illustrated in a top view in FIG. 3. The cross section of the arrangement of the cells 20 taken along the line I-I in FIG. 3 is illustrated in FIG. 1. As illustrated in FIG. 3, an element 30 is formed by a plurality of cells 20. In each element 30, at least either the first electrodes 4 or the second electrodes 6 are electrically connected. The capacitive transducer is driven by the application of a bias voltage to the first electrodes 4 and by using the second electrodes 6 as signal application or extraction electrodes. The substrate 1 is grounded via the electrode pads 24, enabling a reduction in signal noise. This example may also achieve advantages similar to those of the foregoing embodiments and example.

Third Embodiment

The capacitive transducer described above in the foregoing embodiments and examples may be applied to a subject information obtaining apparatus that uses an acoustic wave, such as an ultrasonic diagnostic apparatus or an ultrasonic image forming apparatus. An acoustic wave from a subject is received by a capacitive transducer, and an electrical signal output from the capacitive transducer is used to obtain subject information, examples of which include subject information that reflects an optical characteristic value of the subject, such as the optical absorption coefficient, and subject information that reflects a difference in acoustic impedance.

Figure 4A:
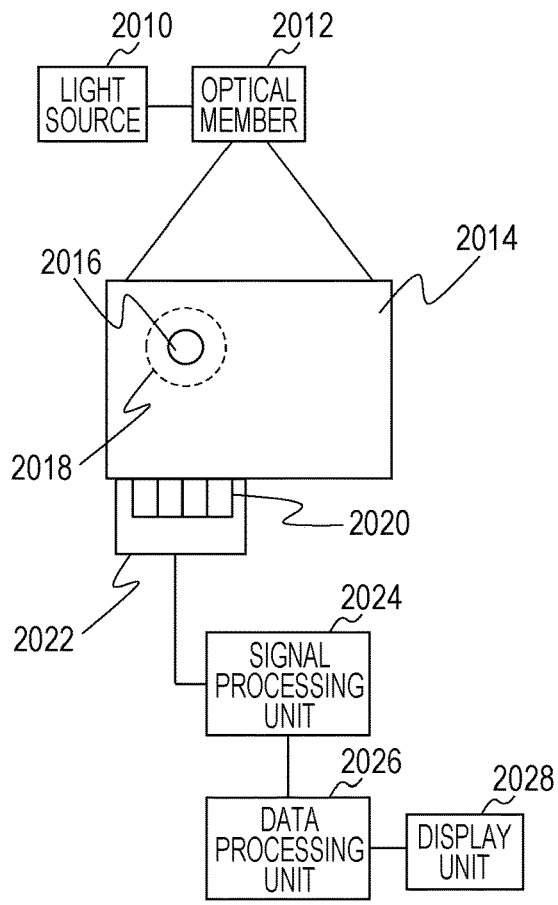
FIGS. 4A and 4B are diagrams illustrating a subject information obtaining apparatus including a capacitive transducer according to a third embodiment of the present invention.

FIG. 4A illustrates an example of a subject information obtaining apparatus that uses the photoacoustic effect. Pulse light generated from a light source 2010 passes through an optical member 2012 which includes a lens, a mirror, and an optical fiber, and is applied to a subject 2014. A light absorber 2016 inside the subject 2014 absorbs the energy of the pulse light, and generates a photoacoustic wave 2018 that is an acoustic wave. A probe 2022 includes a device 2020 which includes an electromechanical transducing device (e.g., a capacitive transducer) according to an embodiment of the present invention. The device 2020 receives the photoacoustic wave 2018, converts the photoacoustic wave 2018 into an electrical signal, and outputs the electrical signal to a signal processing unit 2024. The signal processing unit 2024 performs signal processing, such as analog-to-digital (A/D) conversion and amplification, on the input electrical signal, and outputs the resulting signal to a data processing unit 2026. The data processing unit 2026 obtains, as image data, subject information (characteristic information that reflects an optical characteristic value of the subject, such as the optical absorption coefficient) by using the input signal. As used herein, a collection of the signal processing unit 2024 and the data processing unit 2026 is referred to as a processing section. A display unit 2028 displays an image based on the image data input from the data processing unit 2026. As described above, the subject information obtaining apparatus in this example includes a device according to an embodiment of the present invention, a light source, and a processing section. The device receives a photoacoustic wave generated in response to the irradiation of a subject with light generated from the light source, and converts the photoacoustic wave into an electrical signal. The processing section obtains information on the subject by using the electrical signal.

Figure 4B:
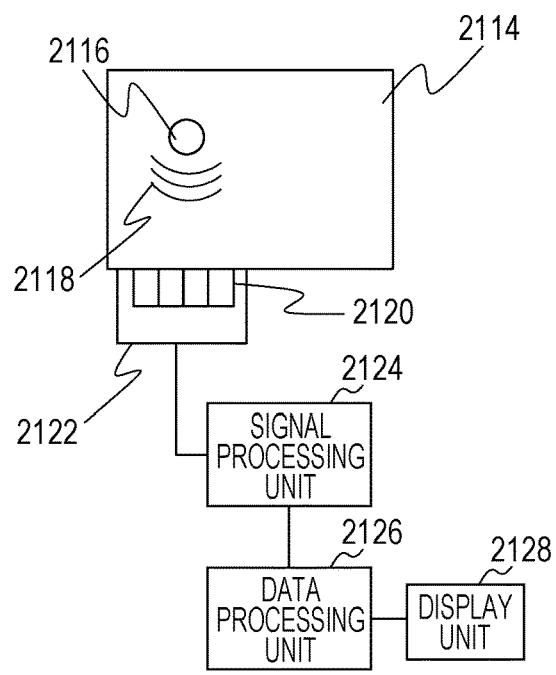

FIG. 4B illustrates a subject information obtaining apparatus that utilizes the reflection of an acoustic wave, such as an ultrasonic echo diagnostic apparatus. A probe 2122 includes a device 2120 which includes an electromechanical transducing device (e.g., a capacitive transducer) according to an embodiment of the present invention. An acoustic wave transmitted from the device 2120 to a subject 2114 is reflected by a reflector 2116. The device 2120 receives the reflected acoustic wave (or reflected wave) 2118, converts the acoustic wave 2118 into an electrical signal, and outputs the electrical signal to a signal processing unit 2124. The signal processing unit 2124 performs signal processing, such as A/D conversion and amplification, on the input electrical signal, and outputs the resulting signal to a data processing unit 2126. The data processing unit 2126 obtains, as image data, subject information (characteristic information that reflects a difference in acoustic impedance) by using the input signal. As also used herein, a collection of the signal processing unit 2124 and the data processing unit 2126 is referred to as a processing section. A display unit 2128 displays an image based on the image data input from the data processing unit 2126. As described above, the subject information obtaining apparatus in this example includes a device according to an embodiment of the present invention, and a processing section that obtains information on a subject by using an electrical signal output from the device. The device receives an acoustic wave from the subject, and outputs an electrical signal.

The probe may be configured to mechanically scan, or may be configured to be moved over a subject by a user such as a physician or an engineer (or may be of a hand-held type). In an apparatus that uses a reflected wave, such as that illustrated in FIG. 4B, a probe that transmits an acoustic wave and a probe that receives the acoustic wave may be separately provided. In addition, an apparatus having the functions of the two apparatuses illustrated in FIG. 4A and FIG. 4B may be used, and may be configured to obtain both subject information that reflects an optical characteristic value of a subject and subject information that reflects a difference in acoustic impedance. In this case, the device 2020 illustrated in FIG. 4A may be configured to not only receive a photoacoustic wave but also transmit an acoustic wave and receive the reflected wave.

The capacitive transducer described above may also be used in, for example, a measurement apparatus that measures the magnitude of an external force. In this case, an electrical signal from a capacitive transducer subjected to an external force is used to measure the magnitude of an external force applied to a surface of the capacitive transducer.

According to an embodiment of the present invention, a device such as a capacitive transducer includes conductive protective films, which are composed of a metal or the like, on surfaces of a through wire on the main surface side and the side opposite the main surface (that is, on both surface sides of the through wire), reducing the connection resistance of the through wire. Thus, good device characteristics are achievable. In addition, the conductive protective films on both surface sides of the through wire have high chemical resistance and the like, resulting in the surfaces of the through wire being less likely to be corroded in the device manufacturing process after the formation of the through wire. Consequently, the surface roughness or the reduction in length of the through wire may be reduced, facilitating connection to a lead wire and the like with excellence and ease.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-161989, filed Aug. 8, 2014, which is hereby incorporated by reference herein in its entirety.

What is claimed is:

1. A device comprising:
a substrate having a first surface and a second surface opposite the first surface, the substrate including a through wire extending therethrough between the first surface and the second surface; and
a conductive protective film which is disposed over at least one of a surface A of the through wire on the first surface side of the substrate and a surface B of the through wire on the second surface side of the substrate,
wherein at least one of the surface A and the surface B is recessed toward the inside of the substrate; and
wherein the surface of the conductive protective film is flush with the surface of the substrate or recessed toward the inside of the substrate.

2. The device according to claim 1, wherein the conductive protective film comprises a multilayer film having two or more layers.

3. The device according to claim 1, further comprising an electrode pad configured to be electrically connected to the through wire via the conductive protective film.

4. The device according to claim 1, further comprising a wire configured to be electrically connected to the through wire via the conductive protective film.

5. The device according to claim 1, wherein the conductive protective film includes a Au film formed on an outermost surface thereof.

6. The device according to claim 5, wherein the conductive protective film includes a Ni film and a Au film, and has the Au film formed on the outermost surface thereof.

7. The device according to claim 1, wherein the through wire is made of Cu or a Cu alloy.

8. The device according to claim 1, wherein the conductive protective film are formed entirely on the surface of the through wire.

9. A method for manufacturing a device, the device including a substrate having a first surface and a second surface opposite the first surface, the substrate including a through wire extending therethrough between the first surface and the second surface:
forming the through wire in the substrate; and
forming a conductive protective film over at least one of a surface A of the through wire on the first surface side of the substrate and a surface B of the through wire on the second surface side of the substrate;
wherein the through wire is formed such that at least one of the surface A and the surface B is recessed toward the inside of the substrate, and
wherein the surface of the conductive protective film is formed to be flush with the surface of the substrate or recessed toward the inside of the substrate.

10. The method according to claim 9, further comprising forming the through wire in the substrate.

11. The method according to claim 9, wherein the conductive protective film is formed entirely on the surface of the through wire.

12. The method according to claim 9, wherein the conductive protective film is formed using electroless plating.

13. The method according to claim 9, wherein the conductive protective film is formed using electroless plating, and is then subjected to surface planarization.

14. A subject information obtaining apparatus comprising:
the device according to claim 1; and
a processing section configured to obtain information on a subject using an electrical signal output from the device and to process the information,
wherein the device is configured to receive an acoustic wave from the subject and to output the electrical signal.

15. The subject information obtaining apparatus according to claim 14, further comprising a light source,
wherein the device is configured to receive an acoustic wave generated by irradiation of the subject with light generated from the light source, and to convert the received acoustic wave into an electrical signal.

16. A measurement apparatus comprising:
the device according to claim 1, the device being subjected to an external force,
wherein the measurement apparatus is configured to measure a magnitude of an external force applied to a surface of the device by using an electrical signal from the device.

17. The method according to claim 9, wherein the material of the conductive protective film contains at least one of Au, Ni, Ag, Pd, Fe, Cr, Nd, W, or Ti, or an alloy thereof.

18. The method according to claim 9, wherein the material of the through wire contains Cu or a Cu alloy.

19. The device according to claim 1, wherein the conductive protective film contains a material having a higher corrosion resistance than that of a material of the through wire.

20. The device according to claim 1, wherein the surface of the through wire is recessed from the first surface and the second surface of the substrate.

21. The device according to claim 1, wherein the conductive protective film is disposed on the surface A and the surface B.

22. The device according to claim 1, further comprising a cell on the first surface, the cell including a first electrode and a second electrode spaced apart from the first electrode with a gap between the first electrode and the second electrode.

23. The method according to claim 9, further comprising a cell on the first surface, the cell including a first electrode and a second electrode spaced apart from the first electrode with a gap between the first electrode and the second electrode.

* * * * *